US006923918B2

(12) United States Patent
Lee et al.

(10) Patent No.: US 6,923,918 B2

(45) Date of Patent: Aug. 2, 2005

(54) METHOD FOR IMPLEMENTING AN EFFICIENT AND ECONOMICAL CATHODE PROCESS

(75) Inventors: Jueng-Gil Lee, Cupertino, CA (US); Matthew A. Bonn, Saratoga, CA (US); Hidenori Kemmotsu, San Jose, CA (US); Kazuo Kikuchi, Yokohama (JP)

(73) Assignees: Candescent Intellectual Property Services, Inc., Los Gatos, CA (US); Candescent Technologies Corporation, Los Gatos, CA (US); Sony Corporation, Tokyo (JP)

( * ) Notice: Subject to any disclaimer, the term of this patent is extended or adjusted under 35 U.S.C. 154(b) by 0 days.

(21) Appl. No.: 09/968,186

(22) Filed: Sep. 28, 2001

(65) Prior Publication Data

US 2003/0226817 A1 Dec. 11, 2003

(51) Int. Cl.[7] ........................ H01B 13/00; G02F 1/136; H01L 21/44

(52) U.S. Cl. ........................... 216/13; 216/84; 438/627

(58) Field of Search ...................... 216/13, 84; 438/627

(56) References Cited

U.S. PATENT DOCUMENTS

| | | | | |
|---|---|---|---|---|
| 5,405,490 A | | 4/1995 | Park et al. | 156/643 |
| 5,786,276 A | | 7/1998 | Brooks et al. | 438/724 |
| 5,801,083 A | | 9/1998 | Yu et al. | 438/424 |
| 5,814,563 A | | 9/1998 | Ding et al. | 438/714 |
| 5,935,877 A | | 8/1999 | Autryve | 438/743 |
| 6,057,172 A | | 5/2000 | Tomihari | 438/20 |
| 6,207,970 B1 | * | 3/2001 | Kim | 257/59 |
| 6,387,600 B1 | | 5/2002 | Hanson | 430/316 |
| 2003/0042840 A1 | * | 3/2003 | Kenmotsu | 313/495 |

* cited by examiner

*Primary Examiner*—Shamim Ahmed
(74) *Attorney, Agent, or Firm*—Ladas & Parry LLP

(57) ABSTRACT

The present invention provides a method of fabricating a cathode requiring relatively few and somewhat simple steps. In one embodiment, a novel etchant gas chemistry dispenses with needing a second passivation layer. In one embodiment, a direct via is formed without a separate mask. In one embodiment, access and isolation features of a metallic gate are patterned in the same patterning operation as an associated passivation layer, dispensing with a need for separate patterning of each. In one embodiment, etching is effectuated with high selectivity for nitrides of silicon. In one embodiment, the requirement for at least one passivation layer deposition, a direct via masking step, and separate patterning steps for the passivation layer and metallic gate are eliminated. This effectively eliminates or substantially reduces associated costs, concomitantly reducing process completion time. Advantageously, this increases efficiency and productivity, correspondingly reducing fabrication costs and unit costs of finished devices.

11 Claims, 24 Drawing Sheets

M1 PAD AREA
M1PA(C)

M2 PAD AREA
M2PA(C)

Active Area

METHOD FOR IMPLEMENTING AN EFFICIENT AND ECONOMICAL CATHODE PROCESS

TECHNICAL FIELD

The present invention relates to processes for manufacturing cathode ray tubes. In particular, the present invention pertains to a novel method for implementing an efficient and economical process for fabricating a cathode for use in a cathode ray tube.

BACKGROUND ART

The flat panel or thin cathode ray tube (CRT) is a widely and increasingly used display device. Thin CRTs, such as the ThinCRT™ of Candescent Technologies Corp., San Jose, Calif., are used in desktop and workstation computer monitors, panel displays for many control and indication, test, and other systems, and television screens, among a growing host of other modern applications.

Thin CRTs work on the same basic principles as standard CRTs. Referring to Conventional Art FIG. 1, beams of electrons E are fired from negatively-charged electrodes, e.g., cathodes C, through an accelerating potential AV in an evacuated glass tube T. The electrons E strike phosphors Ph in front of an aluminum (Al) layer anode A at the front of the tube T, causing them to emit light L, which creates an image on a glass screen GS. One difference is that, in place of the conventional CRT's single large cathode are millions of microscopic electron emitters EE spread across the cathode at the back of the thin CRT, each firing a small beam of electrons E toward the phosphor Ph coated screen GS.

These emitters EE use cold cathode technology, which consumes only a small fraction of the power used by the traditional CRT's hot cathode. It is estimated that a 14.1 inch thin CRT, such as the ThinCRT™ color notebook display, will use less than 3.5 watts, over an order of magnitude less than a typical conventional CRT of roughly 80 watts, and even less than liquid crystal displays (LCD), such as AMLCDs, at equivalent brightness. Referring to Conventional Art FIG. 2, millions of electron emitters EE on the thin CRT cathode C release electrons E that are accelerated towards the phosphor Ph on the thin CRT faceplate GS which, when struck, emits light towards the viewer. Ceramic spacers mechanically support the thin CRT structure, containing high vacuum between the anode A and cathode C, against the imploding forces of ambient atmospheric pressure AAP.

The manufacture of a thin CRT involves a number of specialized, complex technical and industrial fabrication processes. One such process is the formation of the cathode element of the thin CRT. Cathode fabrication processes involve a number of steps, some of them familiar in other aspects of modern electronic manufacturing. However, cathodes for thin CRTs have relatively complex designs, as well as certain unique structural features and material compositions, which tend to complicate their manufacture, in accordance with conventional methods.

With reference to Conventional Art FIG. 3, some of the details of the thin CRT design are described. A dielectric 1 covers a patterned resistor layer 2. Both are disposed over a glass cathode substrate 3, onto which is arrayed row metal 4 and an emitter array 5, shown in detail in blown up internal FIG. 3.1. A single cathodic emitter cone and gate hole micro-array 6 is depicted in detail in blown-up internal FIG. 3.1.1. Column metal 7 is arrayed over the row metal 4. Column metal 7 and row metal 4, together, form individually addressable cathodic locales at their intersections. A focusing grid 8 disposed upon mechanically supportive walls 9 allow electron beams (e.g., electron beams E; Conventional Art FIG. 1) to be focused onto individual pixels, such as pixel 13, which is depicted in the present Figure as "on" (the other pixels therein are depicted as "off"). Pixels, such as pixel 13, form a screen with an anodic Al layer 12 (corresponding to Al anode A; Conventional Art FIGS. 1, 2) and a contrasting blackened matrix 11, all disposed upon a faceplate glass 14 (corresponding to glass screen GS; Conventional Art FIGS. 1, 2).

With reference to Conventional Art FIG. 4, low voltage, planar cold cathodes C are used in thin CRTs. These cathodes contain many individual electron emitters 55 (corresponding to electron emitters EE; Conventional Art FIGS. 1, 2 and cathodic emitter cone and gate hole micro-array 6; Conventional Art FIG. 3), which are addressable with low-voltage, inexpensive drivers via row and column conductors, such as column metal 7 and row metal 4, together forming individually addressable cathodic locales at their intersections. These cathodes exhibit high spatial and temporal uniformity, have a very high degree of emitter redundancy, and can be produced at low cost, relative to other display technologies, such as LCDs and conventional bell tube CRTs.

One such thin CRT cathode is the Spindt Cathode 55, a micron-size metallic cone centered in a roughly micron diameter hole through a top metal and insulator thin films, shown in detail in blown up internal FIG. 4.1. The tip of the cone lies in the plane of the top metal ("gate") film and is centered in the gate hole. The cone has a sharp tip; thus a voltage differential between the cone and gate film causes electrons to emit from the cone tip into the vacuum characterizing an accelerating potential (e.g., AV; Conventional Art FIG. 1). Several approaches for fabricating cold cathodes exist.

One conventional process of fabricating 1 micron scale Spindt emitters 55 requires several relatively slow and costly photolithographic steps. Additionally, at 1 micron gate widths, more expensive integrated circuit drivers rated at 80 volts are needed. This voltage range results in a high power consumption that is unacceptable for portable applications. Spindt cathode power and cost limitations may be overcome if the device geometry is reduced from micron to nanometer-scale, e.g., less than 0.15 microns, and if faster non-photolithographic patterning techniques are employed.

Resulting cold cathode emitters are fabricated over large glass substrates. One type of cold cathode plate is constituted by a matrix array of patterned, individually addressable, orthogonal row and column electrodes (e.g., column metal 7 and row metal 4 together form cathodic locales at their intersections). The intersection (e.g., crossover area) between each row and column defines a sub-pixel element, at which a very dense array of cold cathode emitters is formed. Referring to Conventional Art FIG. 5, row metal conductors (e.g., row metal 4; Conventional Art FIGS. 3, 4) and column metal conductors (e.g., column metal 7; Conventional Art FIGS. 3, 4) are electrically couplable from exposed conductors in the M1 areas 5M1 and the M2 areas 5M2, respectively. Active area 5A contains the actual cathodes (e.g., cathodes 55; Conventional Art FIGS. 3, 4).

Nanometer scale emitters currently allow up to 4,500 emitters to be located at each sub-pixel. This high degree of redundancy results in a defect tolerant fabrication process because a number of non-performing emitters can be tolerated at each sub-pixel site. From a manufacturing cost standpoint this is significant because the one very small element, the cathode emitter, has large redundancy. The remaining device features, such as the rows and columns (e.g., column metal 7 and row metal 4, together, forming individually addressable cathodic locales at their intersections), are relatively low resolution (on the order of 25 to 100 microns) which are compatible with relatively low cost (e.g., non-stepper lithography-based and high yielding) manufacturing processes.

Conventional cathode fabrication processes for thin CRT manufacture involve varying sequences of substrate formation and treatment, photoresistive patterning and etching, layer deposition, structure formation, other etching, cleaning, and related steps. The level of cathodic structural complexity and the nature of constituent materials involved, including lanthanides and group VI B metals and others, has resulted in elaborate fabricative procedures, often with repetitive and reiterative operations. For example, one step common in the conventional art is the masking of passivation layers. Such repetitive or reiterative operations render the conventional art problematic for four related reasons.

With reference to Conventional Art FIG. 6, the steps in a conventional process 600 are presented. In etching cavities for housing the emissive cones (e.g., cathode cones 55; Conventional Art FIGS. 3, 4), a Silicon Nitride ($SiN_x$) inter-layer dielectric (ILD) is attacked by the etchant. To prevent unwanted consumption of this $SiN_x$, a second silicon dioxide ($SiO_2$) passivation layer is masked (step 614), in the conventional art, by blanket coating of photoresistive maskant. This is followed by etching and stripping, deposition of the cathode cones, masking, etching, and stripping of a gate square, deposition of a second ILD layer, and masking, etching, and stripping of a direct via (steps 615 through 619, respectively). The conventional process 600 subsequently configures focus waffles and halos (steps 620–624). As seen in Conventional Art FIG. 6, numerous sets of masking and corresponding etching and related steps and two (2) passivation layers are required to fabricate cathodes for thin CRTs. Further, conventional methods sometimes require photoresist application, and corresponding accompanying process steps, to prevent inordinate consumption of desired passivation layer material during cathode fabrication. This is elaborate, inefficient, and costly. It is especially wasteful in fabricating the M1 and M2 pad areas. Further, no conventional technique exists for combining various repetitive and/or analogous steps or stages of cathode fabrication processes.

Referring to Conventional Art FIGS. 5B and 5C, composite structures M1PA(C) and M2PA(C) show that a layer PR of photoresist covers a desired passivation layer PAN. This is to prevent unwanted deterioration of the passivation layer PAN in the M1 and M2 pad areas, respectively, during subsequent fabricative processing.

The first problem arising from the conventional art is that the elaborate conventional methods are expensive, individually and cumulatively. Second, the complexity of the conventional art, especially with respect to the relatively large number of steps it requires, consumes inordinate time. Third, this renders the production lines involved correspondingly less efficient and productive than desirable, with correspondingly increased costs. And fourth, the total unit cost of the cathode assembly, and correspondingly, complete thin CRT units, is higher than desirable.

What is needed is a method of fabricating a cathode which reduces the number and/or complexity of steps required conventionally. What is also needed is a method of fabricating a cathode which eliminates one or more passivation layer patterning steps, a direct via patterning step, and/or a metallic gate patterning step, required in the conventional art. Further, what is needed is a method of fabricating a cathode which reduces manufacturing costs and increases the efficiency and/or productivity of manufacturing lines engaged in cathode fabrication. Further still, what is needed is a method of fabricating a cathode which reduces the unit cost of thin CRTs manufactured therewith.

DISCLOSURE OF THE INVENTION

The present invention provides, in one embodiment, a method of fabricating a cathode requiring relatively few and somewhat simple steps. In one embodiment, the present invention also provides a method of fabricating a cathode which eliminates a passivation layer patterning steps, a direct via patterning step, and a metallic gate patterning step. Further, in one embodiment, the present invention also provides a method of fabricating a cathode which reduces manufacturing costs and increases the efficiency and productivity of manufacturing lines engaged in cathode fabrication. Further still, the present invention provides, in one embodiment, a method of fabricating a cathode which reduces the unit cost of thin CRTs manufactured therewith.

In one embodiment, a novel method effectuates fabrication of a cathode by a process requiring relatively few and somewhat simpler steps. The process, in one embodiment, involves a number of steps involving technologies well known in the art. Importantly however, in one embodiment, the requirement for at least one of the passivation layer patterning steps, required by conventional cathode fabrication processes, is eliminated. In one embodiment, a direct via patterning step, required by conventional cathode fabrication processes, is eliminated. In one embodiment, a metallic gate chromium (or other metal) patterning step, required by conventional cathode fabrication processes, is eliminated. One embodiment eliminates a passivation layer patterning step, a direct via patterning step, and a metallic gate patterning step.

The elimination of a direct via masking step in accordance with one embodiment of the present effectively eliminates or substantially reduces costs conventionally associated with executing the step and concomitantly reduces the total time necessary to complete the entire process. Advantageously, this increases production line efficiency and productivity, correspondingly reducing fabrication costs and unit costs of finished devices manufactured therewith.

These and other advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Conventional Art

Conventional Art

Conventional Art

Conventional Art

Conventional Art

Conventional Art

Conventional Art

Conventional Art

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and compounds have not been described in detail so as not to unnecessarily obscure aspects of the present invention.

A series of exemplary composite structures constituting stages of cathode fabrication comporting with one embodiment of the present invention is described below. A series of exemplary processes utilizing the steps in a method for forming a cathode according to one embodiment of the present invention follows thereupon each structure, describing its fabrication.

Figure 7A:
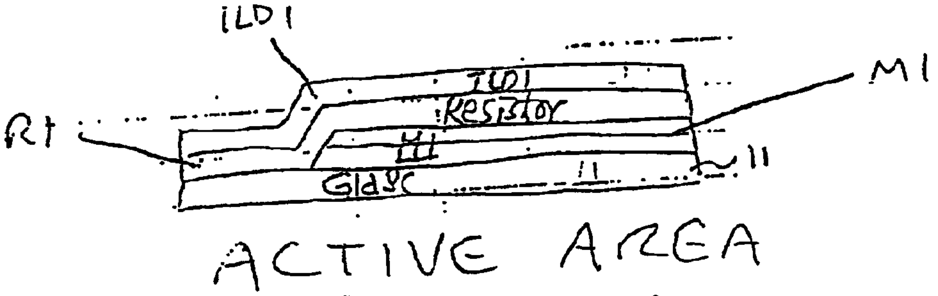
FIG. 7A is a schematic diagram depicting a longitudinal cross-sectional view of a first metallic active layer deposited on a glass substrate, in accordance with one embodiment of the present invention.
Figure 7B:
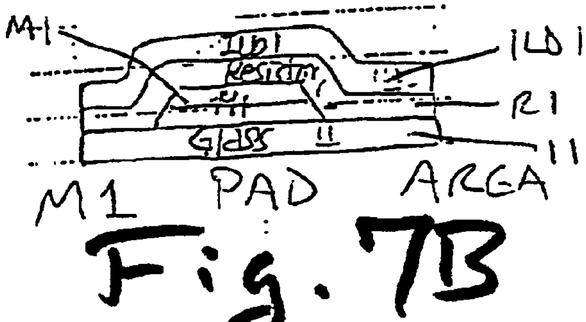
FIG. 7B is a schematic diagram depicting a cross-sectional end view of an first M1 metallic pad deposited on a glass substrate after photoresist application, in accordance with one embodiment of the present invention.
Figure 7C:
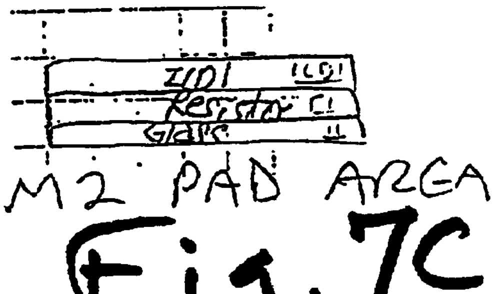
FIG. 7C is a schematic diagram depicting a cross-sectional end view of an inter layer dielectric and resister layer deposited on a glass substrate in the M2 pad area, in accordance with one embodiment of the present invention.
Figure 7D:
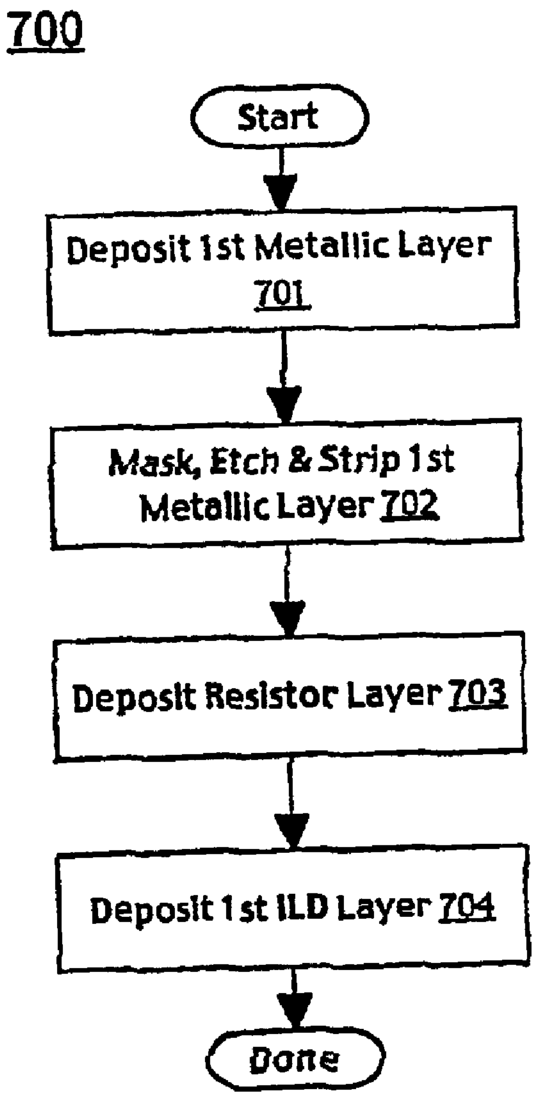
FIG. 7D is a flowchart of the steps in a process for formation of a first base composite structure for a cathode fabrication, in accordance with one embodiment of the present invention.

Exemplary Processes and Corresponding Composite Structures M1 Photolithography and Etching With reference to FIGS. 7A and 7B, a first composite structure 10 is formed by a first active metallic layer M1 deposited on a glass substrate 11, in accordance with one embodiment of the present invention, is depicted in a longitudinal cross-sectional view of the active region and Ml pad area, respectively. FIG. 7C depicts a portion of the same structure in the M2 pad area. FIG. 7D describes the steps in a process 700 for fabricating first composite structure 10, in accordance with one embodiment of the present invention.

Glass substrate 11 is a highly planar sheet of high purity silica glass, fluorosilicate glass, or other suitable glass surface of a suitable thickness, on the order of several millimeters. Metallic layer M1 is deposited in situ upon the upper surface of glass substrate M1; step 701 of process 700 (FIG. 7D).

In one embodiment, metallic layer M1 is an alloy of aluminum (Al), neodymium (Nd), molybdenum (Mo), and tungsten (W). In several embodiments, the relative composition of the alloyed metals may vary. In one embodiment, another lanthanide may be substituted for Nd. In one embodiment, chromium (Cr) or metals selected from other periodic table groups with properties sufficiently close to the properties of the metals of group VIB may replace Mo and/or W to varying degrees.

The deposition in situ may be accomplished by a number of methods well known in the art. In one embodiment, metallic oxide chemical vapor deposition (MOCVD) may be used. In another embodiment, another form of chemical vapor deposition (CVD) may be used. In one embodiment, physical vapor deposition (PVD) may be used. In one embodiment, a plating technology such as electroless plating may be used to deposit metallic layer M1.

Step 702 of process 700 (FIG. 7D) is accomplished in the following manner. Upon deposition of metallic layer M1, a photoresistive masking agent (PR) masks metallic layer M1 according to a designed pattern. After masking, the metallic layer M1 is etched by any of a number of photolithographic processes well known in the art accordingly. Applicable etching methods include reactive ion etching (RIE), plasma assisted dry etching, or wet etching with acetone or other organic solvents. Metallic layer M1 is etched to conform to the contours of the corresponding pattern. Remaining PR maskant is stripped by methods well known in the art.

In one embodiment, a resistor is then fabricated by deposition of a layer of resistive material R1 upon the first metallic layer M1 and remaining glass surface 11 uncovered by metal from metallic layer M1; step 703 (process 700; FIG. 7D). The resistive material forming resistor R1, in one embodiment, is silicon carbide (SiC). In one embodiment, resistor R1 is cermet, or another ruthenium (Ru) based resistive material. In another embodiment, resistor R1 is a nickel-chromium alloy (e.g., nichrome) or an oxide thereof. In one embodiment, resistor R1 is a dual-stack resistor formed by combining layers of SiC and cermet, or similar Ru based resistive material. Deposition of the resistor R1 is accomplished by any of a number of procedures well known in the art, including electroplating, electroless plating, CVD, MOCVD, PVD, and sputtering. In one embodiment, cathodes are formed without deposition of a resistor in the active area.

An inter-layer dielectric (ILD) ILD1 is deposited over the resistor R1; step 704 (process 700; FIG. 7D). In one embodiment, inter-layer dielectric ILD1 is silicon oxide ($SiO_2$). In one embodiment, inter-layer dielectric ILD1 is an organic polymer, such as a polyimide. In one embodiment, inter-layer dielectric ILD1 is SiLK™, a product of Dow Corning, of Midland, Mich., or FLARE™, a product of Honeywell, of Morristown, N.J. In one embodiment, various organic polymers may be combined to constitute inter-layer dielectric ILD1. In the $SiO_2$ embodiment, inter-layer dielectric ILD1 is deposited by CVD or PVD.

In embodiments of the present invention utilizing SiLK™ and/or FLARE™, inter-layer dielectric ILD1 may be deposited on the surface of resistor R1 by a spin coating process, a technique well known in the art. In other embodiments, other deposition processes known in the art may be used. After application, inter-layer dielectric ILD1 may be treated as necessary by baking and curative processes well known in the art, to render inter-layer dielectric ILD1 and the material therein amenable to subsequent processing.

M2 and Metal Gate Photolithography and Etching

Figure 8A:
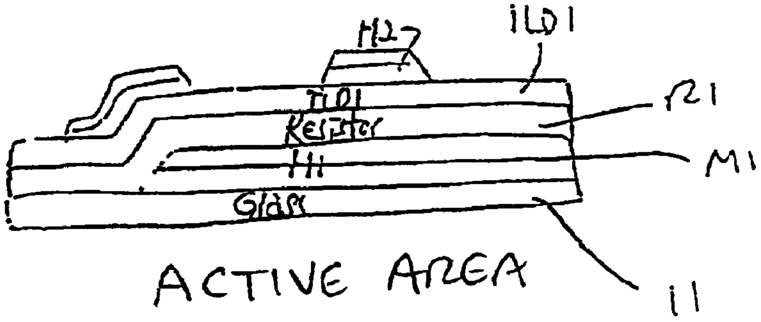
FIG. 8A is a schematic diagram depicting a longitudinal cross-sectional view of a metallic gate and second metallic conductor deposited on an inter layer dielectric covering a first metallic layer in an active area and an M2 pad area, in accordance with one embodiment of the present invention.
Figure 8B:
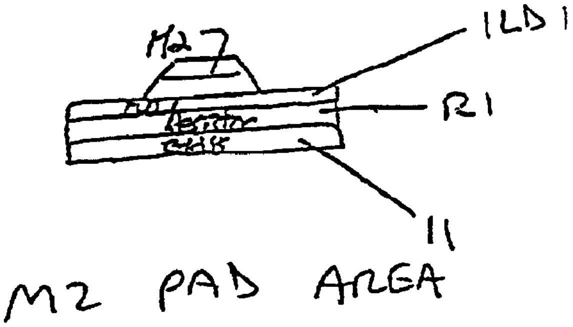
FIG. 8B is a schematic diagram of a cross-sectional end view of a Cr deposition in the M2 pad area, in accordance with one embodiment of the present invention.
Figure 8C:
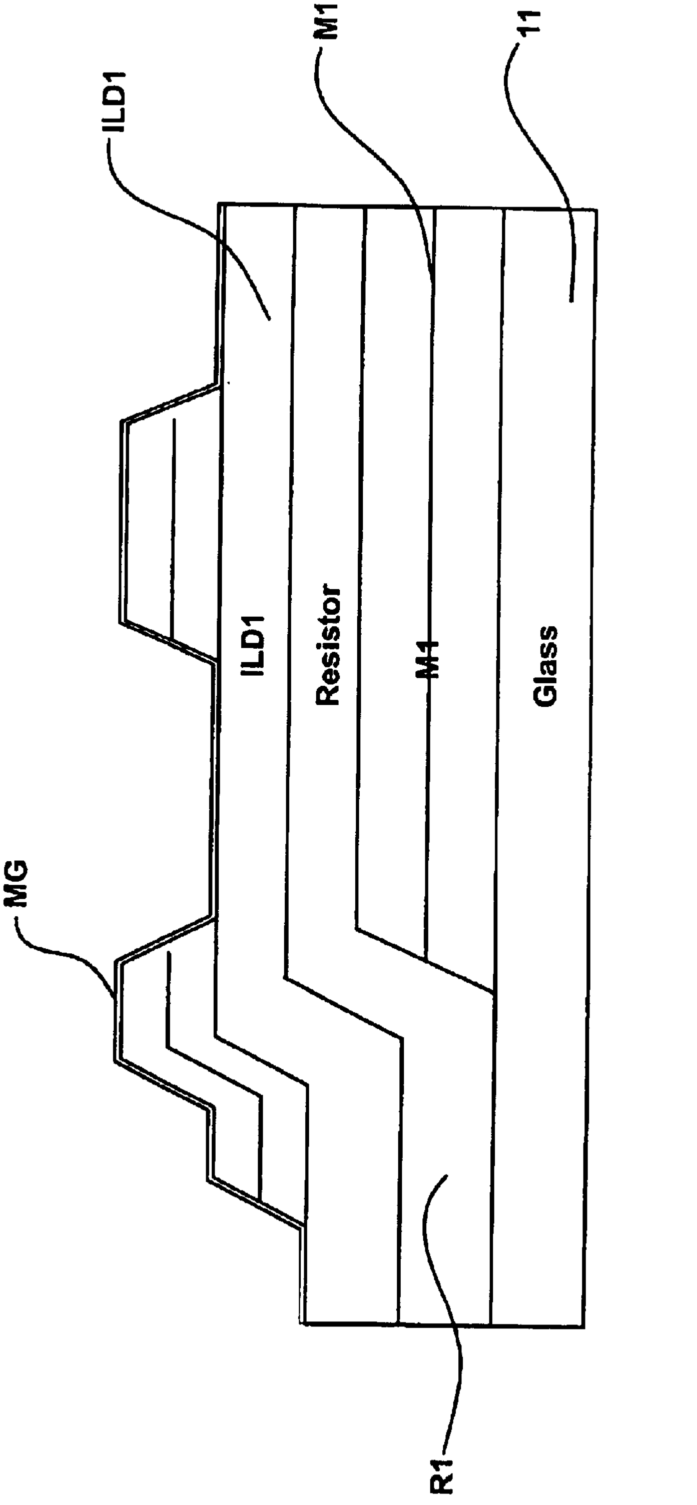
FIG. 8C is a schematic diagram depicting a longitudinal cross-sectional view of a metallic gate deposited on an inter layer dielectric covering a first metallic layer in an active area, in accordance with one embodiment of the present invention.
Figure 8D:
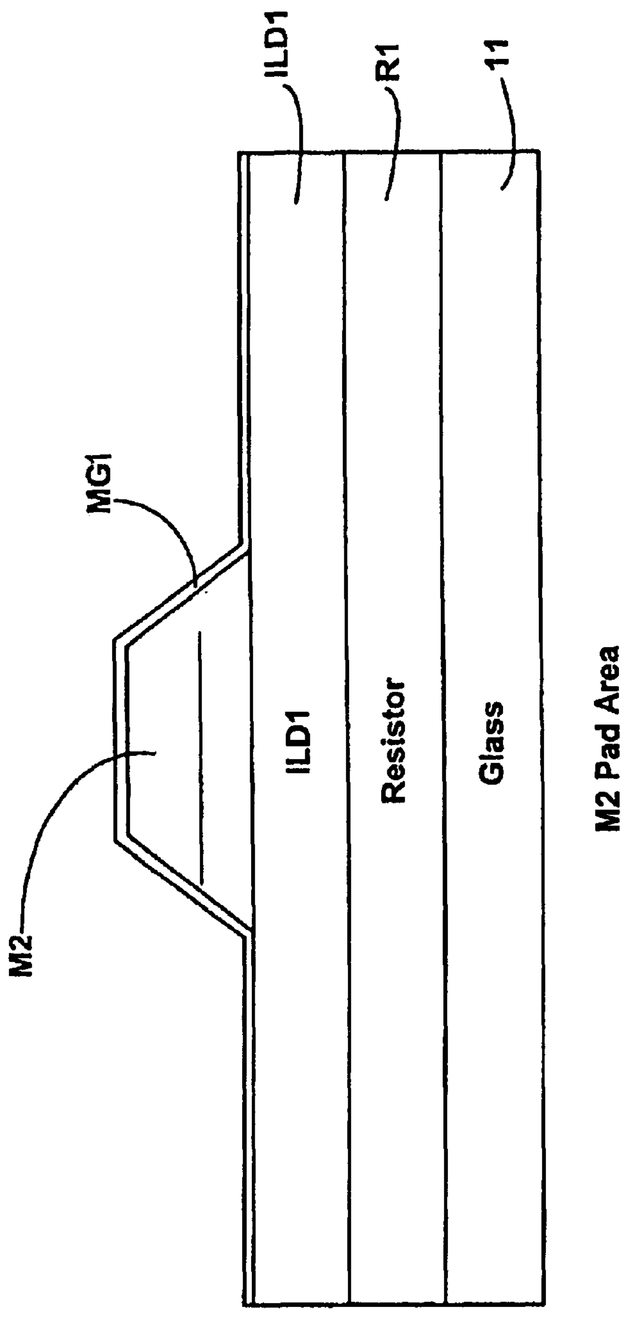
FIG. 8D is a schematic diagram of a cross-sectional end view of a Cr deposition in the M2 pad area, in accordance with one embodiment of the present invention.
Figure 8E:
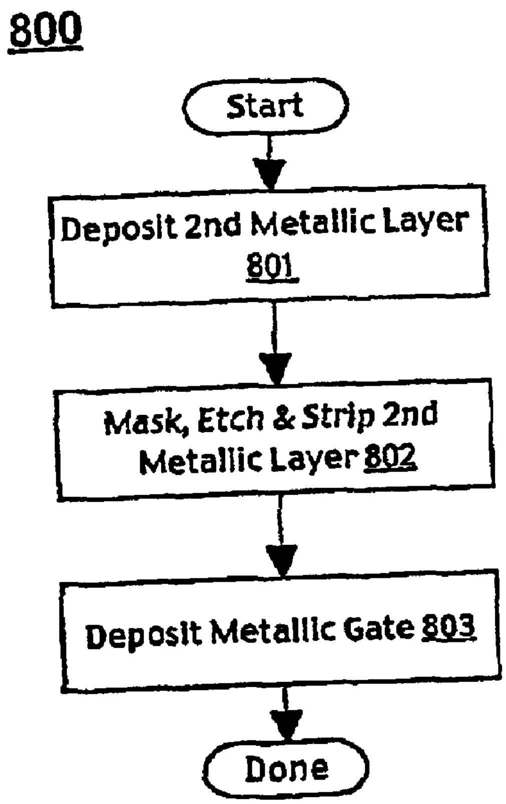
FIG. 8E is a flowchart of the steps in a process for formation of a second composite structure for a cathode fabrication, in accordance with one embodiment of the present invention.

With reference to FIGS. 8A and 8B, a second composite structure 20 is formed by a second metallic layer M2 deposited upon the inter-layer dielectric ILD1. In FIGS. 8C and 8D, a metallic gate MG deposited on metallic layer M2, in accordance with one embodiment of the present invention, by a process 800 of FIG. 8E. In FIGS. 8A and 8B, composite structure 20.1 is depicted in a longitudinal cross-sectional view of the active area, and the M2 pad area, respectively. In FIGS. 8C and 8D, composite structure 20.2 is depicted in a longitudinal cross-sectional view of the active area, and the M2 pad area, respectively.

In step 801 of process 800 (FIG. 8E), metallic layer M2 is deposited in situ upon the upper surface of inter-layer dielectric ILD1. In one embodiment, metallic layer M2 is an alloy of Al, Nd, Mo, and W. In several embodiments, the relative composition of the alloyed metals may vary. In one embodiment, another lanthanide may be substituted for Nd. In one embodiment, Cr or metals selected from other periodic table groups with properties sufficiently close to the properties of the metals of group VIB may replace Mo and/or W to varying degrees.

The deposition in situ may be accomplished by a number of methods well known in the art. In one embodiment, MOCVD may be used. In another embodiment, another form of CVD may be used. In one embodiment, PVD may be used. In one embodiment, a plating technology such as electroless plating may be used to deposit metallic layer M2.

Step 802 of process 800 is accomplished in the following manner. Upon deposition of metallic layer M2, a PR masking agent masks metallic layer M2 according to a designed pattern. After masking, the metallic layer M2 is etched by any of a number of photolithographic processes well known in the art accordingly. Applicable etching methods include RIE, plasma assisted dry etching, or wet etching with acetone or other organic solvents. Metallic layer M2 is etched to conform to the contours of the corresponding pattern. Remaining PR maskant is stripped by methods well known in the art.

Next, referring to FIG. 8C, in step 803 (FIG. 8E), a metallic gate MG1 is deposited upon metallic layer M2 and over remaining exposed surfaces of inter-layer dielectric ILD1. Typically, Cr is the material constituting the metallic gate MG1, and in one embodiment, forms the sole content of metallic gate MG1. However, in another embodiment, other metals and/or alloys of Cr and other metals may be used to form the metallic gate MG1. Metallic gate MG1 material is deposited by electroplating, electroless plating, MOCVD, CVD, PVD, or other methods well known in the art. The thickness of the gate Cr deposited ranges from 200 to 1,000 Angstroms (Å). This thickness of Cr deposition is necessary, because Cr may be consumed somewhat excessively during subsequent processing, specifically resistor (e.g., resistor R1; FIG. 9B) etching steps (e.g., dual resistor dry etch step 906, process 900; FIG. 9D).

Importantly, upon deposition of the Cr (or other material) constituting the metallic gate MG1, a shadow maskant is applied to exposed or proximate thinly covered layers of the first metallic layer M1. Advantageously, this prevents the deposition of unwanted Cr (or other metallic gate MG1 constituent) in the area of the pad M1 formed by the first metallic layer.

Passivation Photolithography and Etching

Figure 9A:
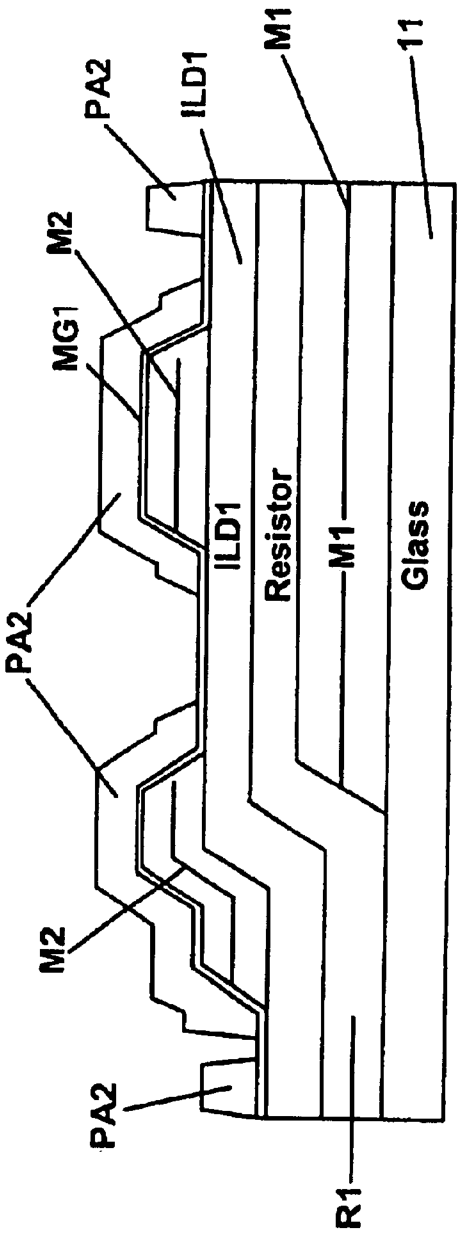
FIG. 9A is a schematic diagram depicting a longitudinal cross-sectional view of a passivation layer deposition in the active area, over the metallic gate (FIG. 8A) and with a gate chromium (Cr) layer applied, after etching, in accordance with one embodiment of the present invention.
Figure 9B:
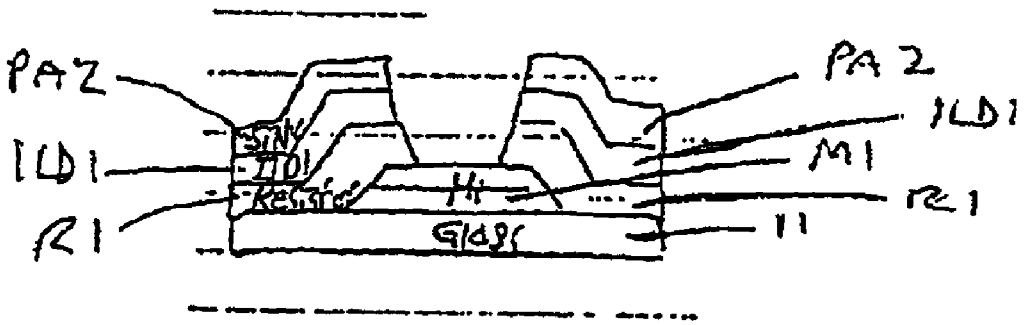
FIG. 9B is a schematic diagram depicting a cross-sectional end view of a passivation layer deposition over the first metallic layer (FIG. 7B) in the M1 pad area, after etching, in accordance with one embodiment of the present invention.
Figure 9C:
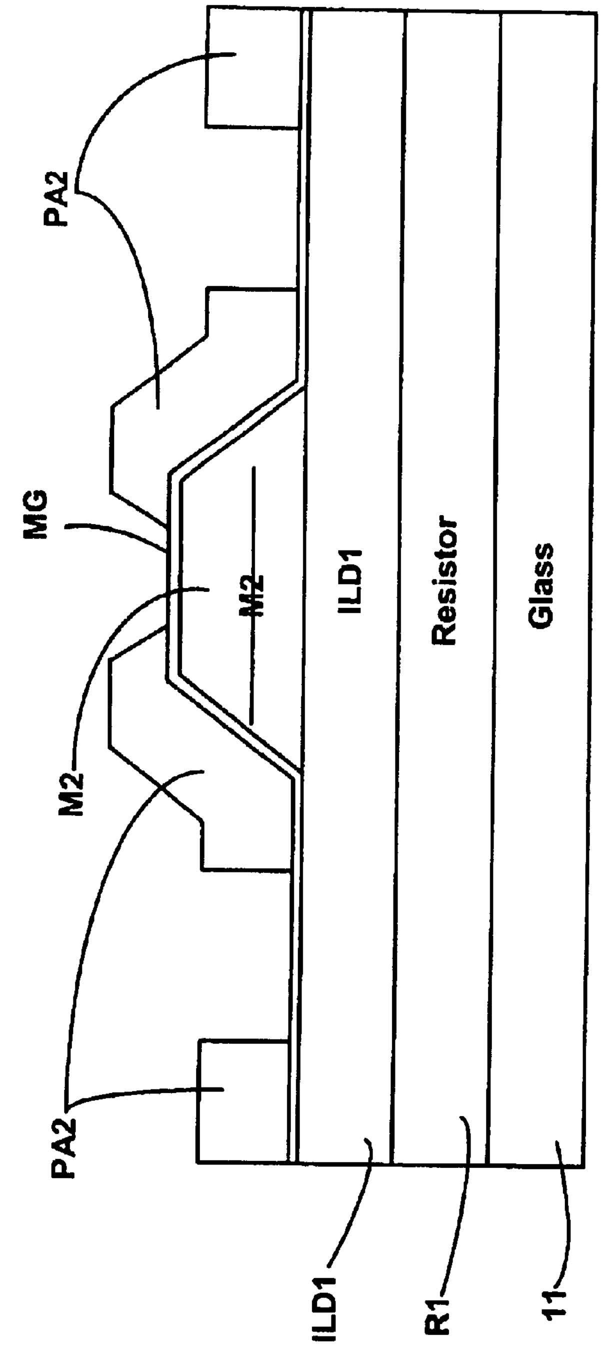
FIG. 9C is a schematic diagram depicting a cross-sectional end view of a passivation layer deposition over the metallic gate (FIG. 8B) and second metallic layer in the M2 pad area, after etching, in accordance with one embodiment of the present invention.
Figure 9D:
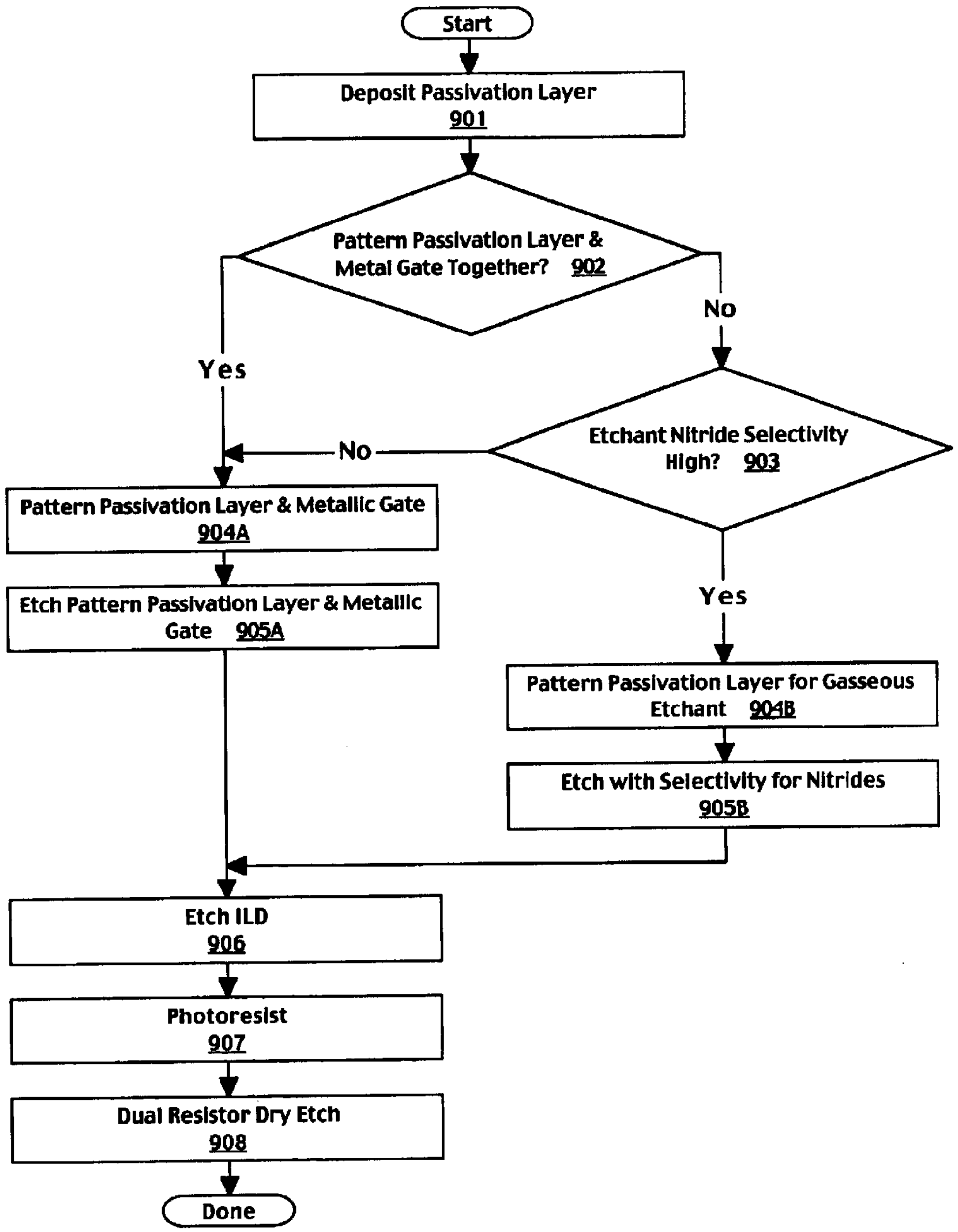
FIG. 9D is a flowchart of the steps in a process for formation of a third composite structure for a cathode fabrication, in accordance with one embodiment of the present invention.

With reference to FIGS. 9A and 9B, a third composite structure 30 formed by deposition of a hard passivation layer PA2, in accordance with one embodiment of the present invention, is depicted in a longitudinal cross-sectional view of the active area, and the M1 pad area, respectively. FIG. 9C depicts the M2 pad area. FIG. 9D describes a process 900 for forming composite structure 30.

By forming a direct via, these steps effectively expose the M1 bus line in the M1 pad area for electrically coupling driver ICs to the cathode array under fabrication herein. However, these steps form the direct via in such a way as to eliminate the costly conventionally required steps associated with multiple phororesitive masking of the passivation layer PA2 in the M1 and M2 pad areas.

Further, in one embodiment, the passivation layer PA2 is masked for patterning by a PR maskant that patterns metallic gate MG1 features, in addition to the passivation layer PAN design. The masking, in this particular implementation, patterns the passivation layer and simultaneously fixes a location for both access spots and inter-pixel electrical isolation areas to Cr constituting metallic gate MG1. Importantly, the present implementation effectively eliminates a subsequent metallic gate Cr masking and etching step, required in the conventional art for electrically segregating individual pixel elements. Advantageously, this streamlines and economizes cathode fabrication.

Process 900 begins with step 901 (FIG. 9D), wherein a passivation layer PA2 is deposited by CVD, PVD, or another technique known in the art. Passivation layer PA2 is, in one typical embodiment, a nitride of silicon ($SiN_x$) such as silicon nitride (SiN). In another embodiment, passivation layer PA2 may be silicon oxynitride (SiON), or a mixture of this compound with a $SiN_x$. The depth of passivation layer PA2 ranges from 500 to 10,000 Å. In certain applications, applying a passivation layer (e.g., PA2) in this range of depth prior to further etching operations, is advantageous. Such applications include those in which etchants are used that are relatively non-selective of nitrides of silicon, with respect to oxides of silicon (e.g., $SiO_2$), such as those constituting proximate structural features (e.g., ILD ILD1).

Efficient Combinational Patterning Implementation

In step 902, it is determined whether patterning of the passivation layer PA2 will be accompanied by simultaneous patterning of certain features of metallic gate MG1. If it is determined in step 902 to so pattern passivation layer PA2 simultaneously with patterning metallic gate MG1, process 900 proceeds via step 904A. In this step, passivation layer PA2 is patterned such that its mask design, besides patterns the passivation layer as necessary to effectuate the desired passivation layer arrangement, incorporates attributes that effectuate simultaneous patterning of certain features of metallic gate MG1, if combinational patterning is desired.

Figure 1:
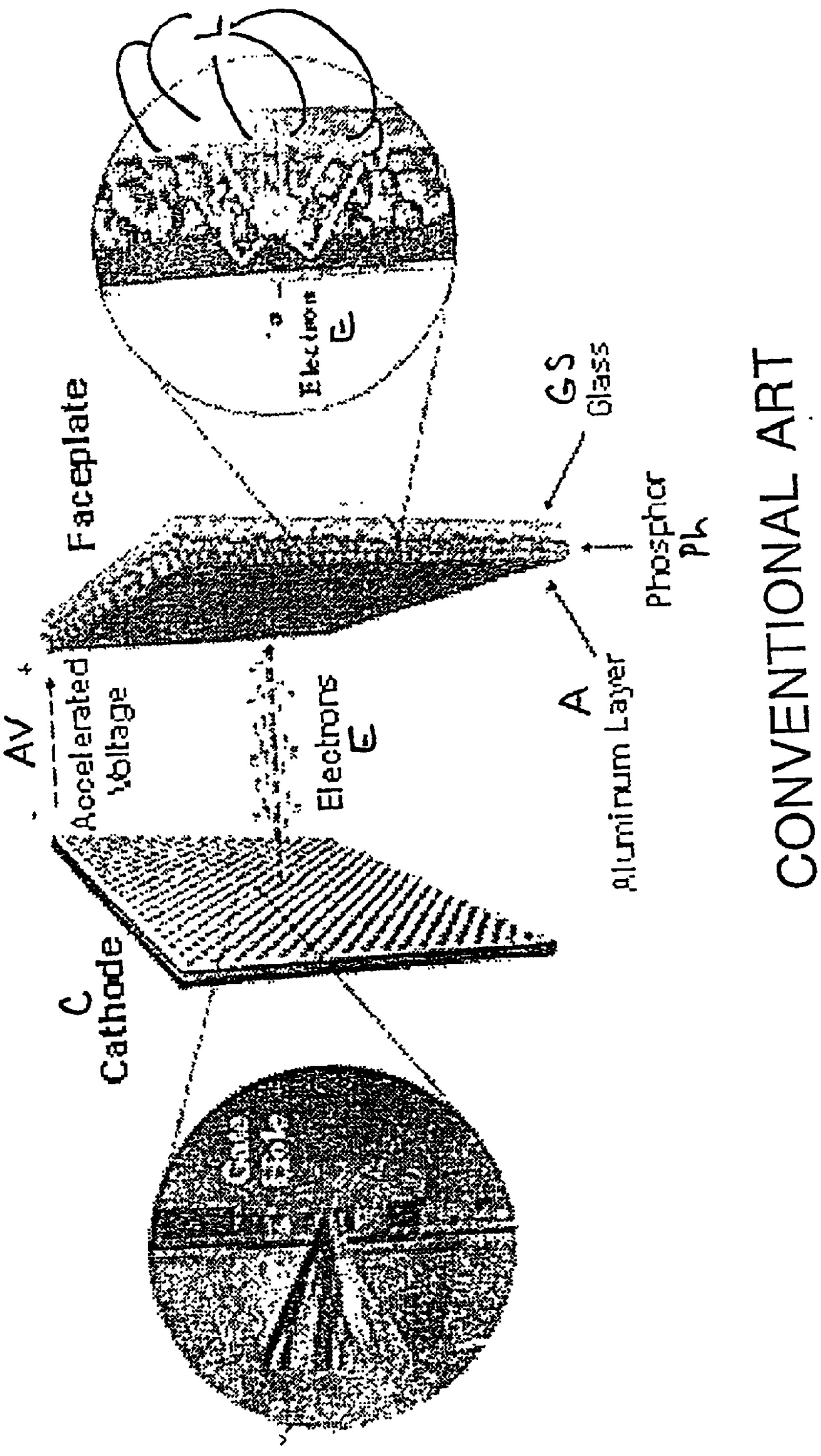
CONVENTIONAL ART FIGURE 1
FIG. 1 is a cutaway view of the insides of a flat panel CRT, depicting cathodic electron emission and acceleration toward a fluorescent screen.
Figure 2:
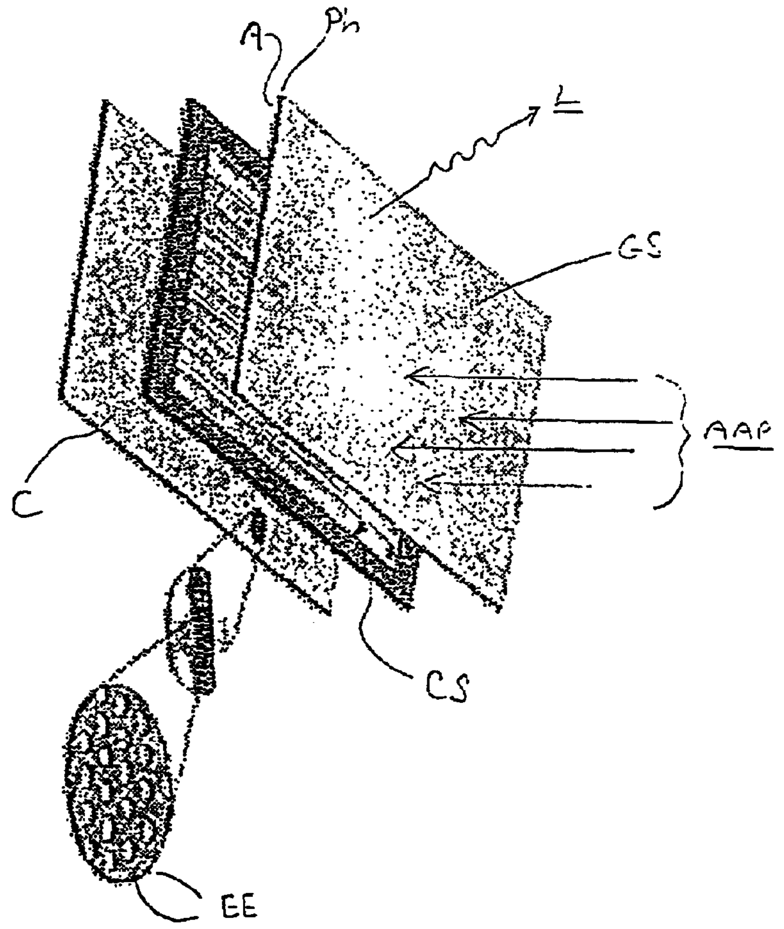
CONVENTIONAL ART FIGURE 2
FIG. 2 is an exploded view of the insides of a flat panel CRT, depicting ceramic spacers and resistance to ambient atmospheric pressure.
Figure 3:
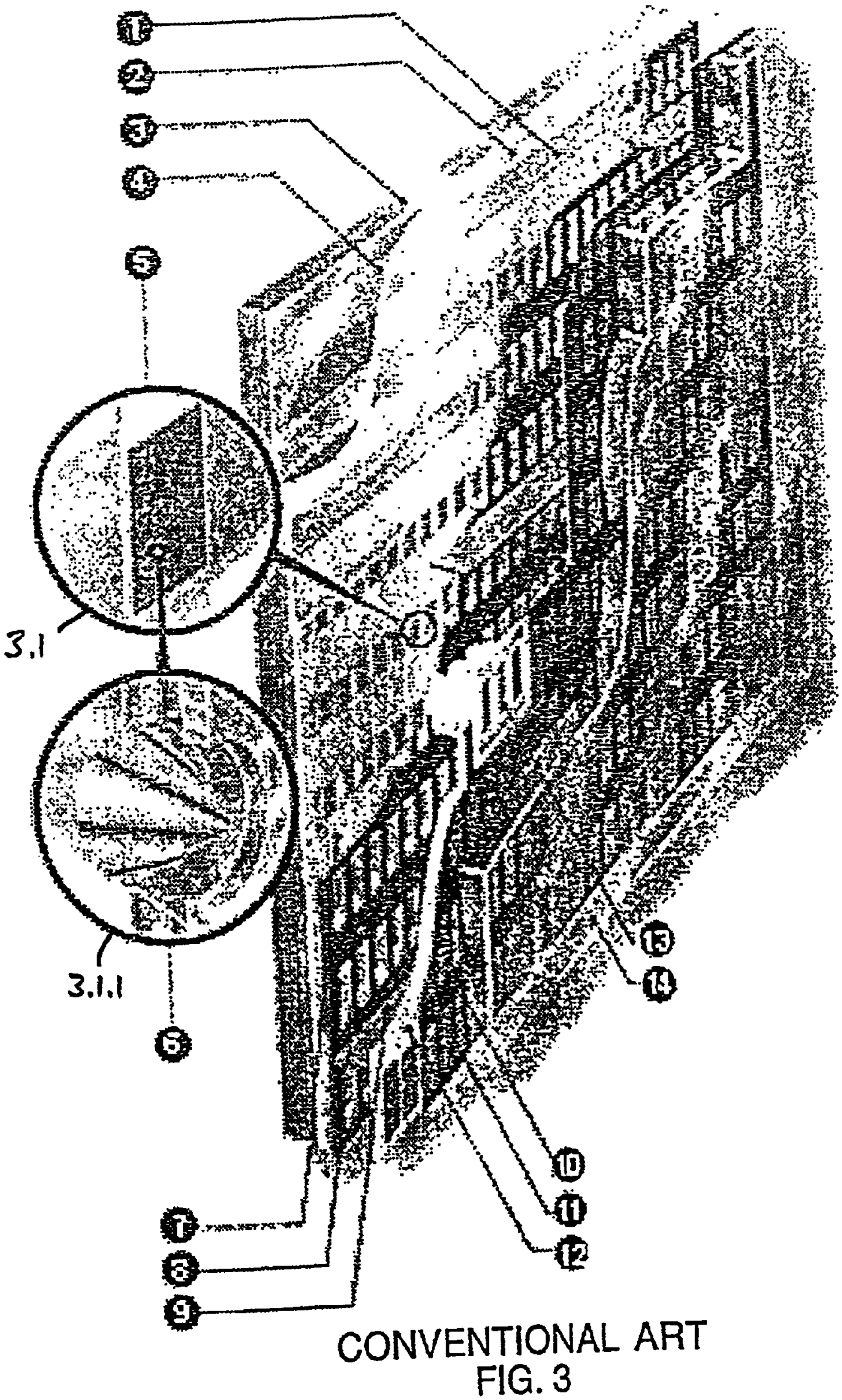
CONVENTIONAL ART FIG. 3
FIG. 3 is a structural schematic of a flat panel CRT, with two collapsing detailed internal diagrams depicting the details of a cathode at two subsequent levels of magnification.

The features of metallic gate MG1 amenable to patterning with passivation layer PA2 include electrical segregation of, and access to, individual pixels (e.g., pixel 13; C.A. FIG. 3). These features are effectuated by patterning passivation layer PA2 in such a way as to fix a location for both electrical access spots (e.g., sweet spots) and inter-pixel electrical isolation areas to Cr, Cr alloy, or other metal constituting metallic gate MG1.

Figure 11A:
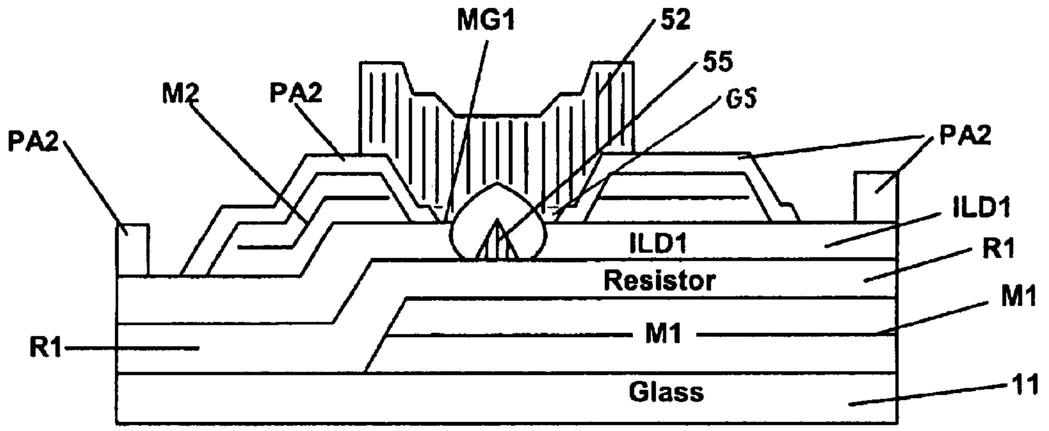
FIG. 11A is a schematic diagram depicting a longitudinal cross-sectional view of a cathodic cone metal and Gate Square deposition in the active area, in accordance with one embodiment of the present invention.

Importantly, the present implementation effectively eliminates a subsequent metallic gate Cr masking and etching step, required in the conventional art. Advantageously, this streamlines and economizes cathode fabrication. If the present implementation is not effectuated, patterning of the Cr metallic gate is accomplished separately, later in the cathode fabrication process (e.g., step 1130 of process 1100; FIG. 11D).

In one embodiment, patterning passivation layer PA2 to accomplish step 904A involves photolithographic masking processes, well known in the art. In one embodiment as discussed below (e.g., wherein decision step 903 is negative), step 904A proceeds to pattern passivation layer PA2 by these well known photolithographic masking processes, even in implementations wherein metallic gate MG1 features are not patterned simultaneously with the passivation layer PA2.

In step 903, it is decided whether the etching of passivation layer PA2 must proceed with high etchant selectivity for the nitrides of silicon constituting passivation layer PA2, with respect to oxides of silicon (e.g., $SiO_2$), such as those constituting proximate structural features (e.g., ILD ILD1). In certain implementations, etchant selectivity for nitrides of silicon with respect to oxides of silicon is not especially crucial. One such implementation exists where thicknesses of silicon nitrides (in the range of 500 to 10,000 Å) constituting passivation layer PA2 are sufficient to endure non-nitride-selective etching. If it is decided in step 903 that high etchant nitride selectivity is not applicable, patterning of passivation layer PA2 proceeds by step 904A, and may incorporate simultaneous patterning of features of metallic gate MG1, as discussed above.

Etching

Following patterning of the passivation layer PA2 (with or without simultaneous patterning for metallic gate MG1 features), etching of passivation layer PA2 (and of metallic gate MG1 features, if patterned) proceeds by step 905A. After masking, the passivation layer PA2 is etched, in one embodiment by a $SiN_x$ dry etching method. RIE or plasma assisted dry etching may accomplish the passivation etch, in one embodiment. In another embodiment, a gaseous $SiN_x$ etchant may be applied. In one embodiment, the etchant is constituted by a gaseous mixture of various combinations and/or volume percentages of sulfur hexafluoride ($SF_6$), carbon tetrafluoride ($CF_4$), trifluoromethane ($CHF_3$), and oxygen ($O_2$).

If, in step 903, it is decided to apply an etchant with extremely high selectivity for nitrides of silicon, etching proceeds in accordance with an alternative embodiment, as described below.

Alternative Embodiment: Elimination of Photolithographic Passivant Etching

Alternatively, another embodiment minimizes consumption of the nitrides of silicon constituting the passivation layer PA2 without requiring masking of the passivation layer PA2 with a photoresistive maskant. In the alternative embodiment, an etching process with extremely high selectivity to the passivation $SiN_x$ is applied. The passivation layer is patterned for a gaseous etchant; step 904(B).

In step 905(B), a suitable dry etching process for cavity oxide etches with such selectivity for nitrides of silicon applies an etchant gas mixture with a novel chemistry. The gas mixture includes octaflurocyclobutane (c-$C_4F_8$), carbon monoxide (CO), argon (Ar), and nitrogen ($N_2$). The individual gaseous compounds and elements constitute the etchant mixture in the volume percentage ranges given in Table 1, below.

TABLE 1

| Gas | Volume Per Cent Composition |
|---|---|
| c-$C_4F_8$ | 5–20% |
| CO | 30–60% |
| Ar | 30–60% |
| $N_2$ | 0–20% |

Dry etching in accordance with step 905(B) in the alternative embodiment effectuates elimination of the photoresistive masking and corresponding steps required by the conventional art, yet still minimizing the consumption of passivation nitrides of silicon. Advantageously, eliminating the passivation photoresistive mask and all corresponding steps reduces manufacturing costs, increases productivity, and reduces unit costs of cathodes for flat panel display devices.

Importantly, in the present (e.g., alternative) embodiment, patterning of the Cr metallic gate must be accomplished separately, later in the cathode fabrication process (e.g., step 1130 of process 1100; FIG. 11D).

Completion of Passivation Etching

Next, in step 906, whether passivation layer PA2 etching has been accomplished by either step 905(A) or step 905(B), the inter-layer dielectric ILD1 is etched by wet etching. In the M1 pad area, inter-layer dielectric ILD1 is etched by $SiO_2$ wet etching with pad etchants such as hydrofluoric acid (HF) solutions accordingly.

In step 907, photoresist is applied, patterned, and baked. A dual resistor dry etch is then performed on the dual-composite SiC/cermet (or other dual-composite) resistor R1 accordingly and remaining Mankato is stripped; step 908. Importantly, the etchant selected and the etching process utilized to etch resistor R1 is a highly selective etchant for discriminating between the material constituting the resistor R1 and the Cr constituting the metallic gate MG1. Advantageously, application of a highly selective etchant and etching process to etch resistor R1 effectuates tight process control over the thickness of both the gate Cr constituting metallic gate MG1 and the material constituting resistor R1.

Referring specifically to FIG. 9B, it is seen that, at one part of composite structure 30, a portion of the first metallic layer M1 is exposed in the M1 pad area. Exposure of this portion was effectuated upon completion of all of the selective etching through a via formed by the successive etching from the surface of the overlying passivation layer PA2, the inter-layer dielectric ILD1, and the resistor R1 to the upper surface of the first metallic layer M1. This exposes a contactable metal surface to effectuate addressable electrical connection via the M1 conductor to individual cathode pixels.

Referring specifically to FIG. 9C, it is seen that a portion of the gate Cr constituting metallic gate MG1 overlying inter-layer dielectric ILD1 is exposed at one part of composite structure 30 in the M2 pad area through openings etched in the passivation layer PA2. This exposes a contactable metal surface to effectuate addressable electrical connection via the M2 conductor to individual cathode pixels.

Referring again to FIG. 9A, it is seen that a part of the gate Cr layer MG1 is exposed at one part of composite structure 30 through openings etched in the passivation layer PA2.

Process 900 is complete upon accomplishment of the dual resistor dry etch of step 908.

Cathode Cavity Formation

Figure 10A:
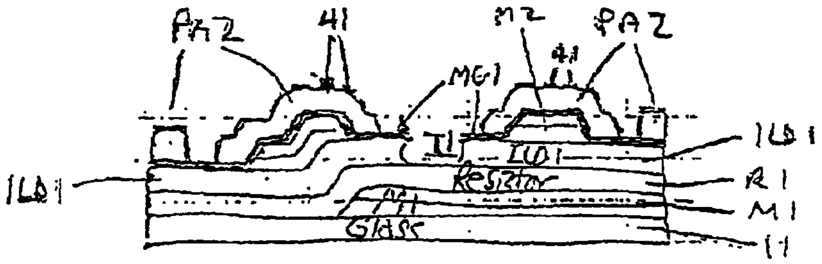
FIG. 10A is a schematic diagram depicting a longitudinal cross-sectional view of a stick Cr layer deposition over the metallic gate (FIG. 8A) in the active area, in accordance with one embodiment of the present invention.
Figure 10B:
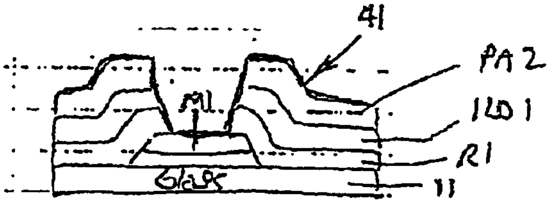
FIG. 10B is a schematic diagram depicting a cross-sectional end view of a stick Cr layer deposition over the first metallic layer (FIG. 9B) in the M1 pad area, in accordance with one embodiment of the present invention.
Figure 10C:
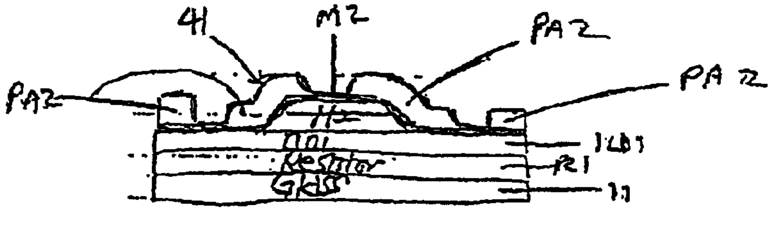
FIG. 10C is a schematic diagram depicting a cross-sectional end view of a passivation layer deposition over the metallic gate (FIG. 9C) in the M2 pad area, in accordance with one embodiment of the present invention.
Figure 10D:
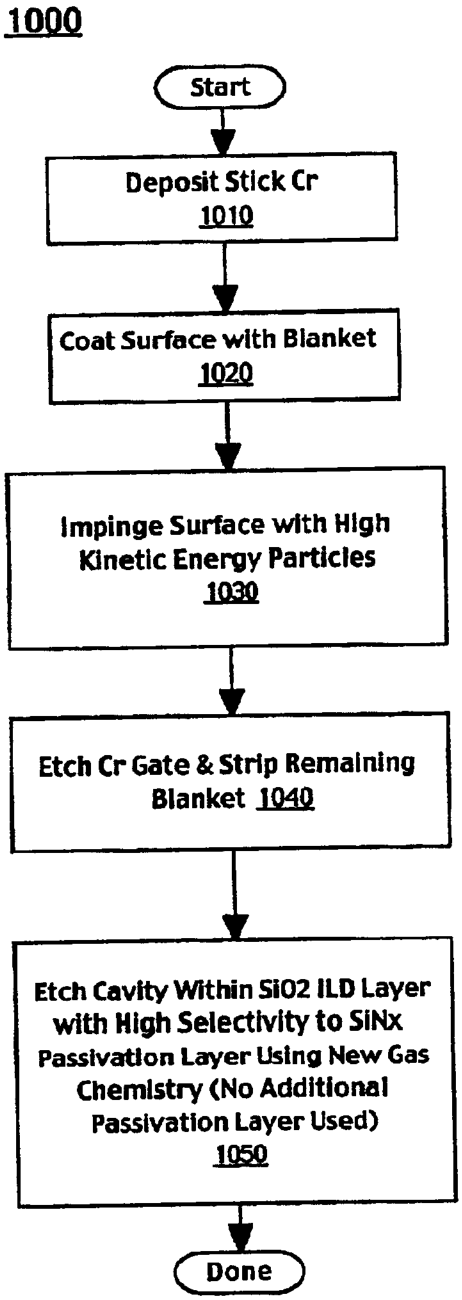
FIG. 10D is a flowchart of the steps in a process for formation of a fourth composite structure for a cathode fabrication, in accordance with one embodiment of the present invention.

With reference to FIGS. 10A, 10B, and 10C, a fourth composite structure 40 is formed by deposition of stick Cr and formation of a cavity for the cathode (e.g., cathode cone 55; FIG. 11A) to be formed in accordance with one embodiment of the present invention. This is depicted in a longitudinal cross-sectional view of the active area (10A), the M1 pad area (FIG. 10B), and the M2 pad area (FIG. 10C), respectively. The fourth composite structure is formed by a process 1000, in one embodiment of the present invention explained by reference to FIG. 10D.

Process 1000 effectuates a method for forming an array of cavities T1 for cathodic emitters and corresponding gates in a base structure for a cathode of a flat panel display. The base structure is formed with a first passivation layer having a certain thickness.

In step 1010, stick Cr 41 is deposited upon the surface of the $SiN_x$ passivation layer PA2 by electroplating, electroless plating, MOCVD, other CVD, PVD, or another technique well known in the art. The stick Cr 41 covers the $SiN_x$ constituting the passivation layer PA2, and the exposed surfaces of the first and second metallic layers M1 and M2, as seen in FIGS. 10A, 10B, and 10C, respectively.

Figure 4:
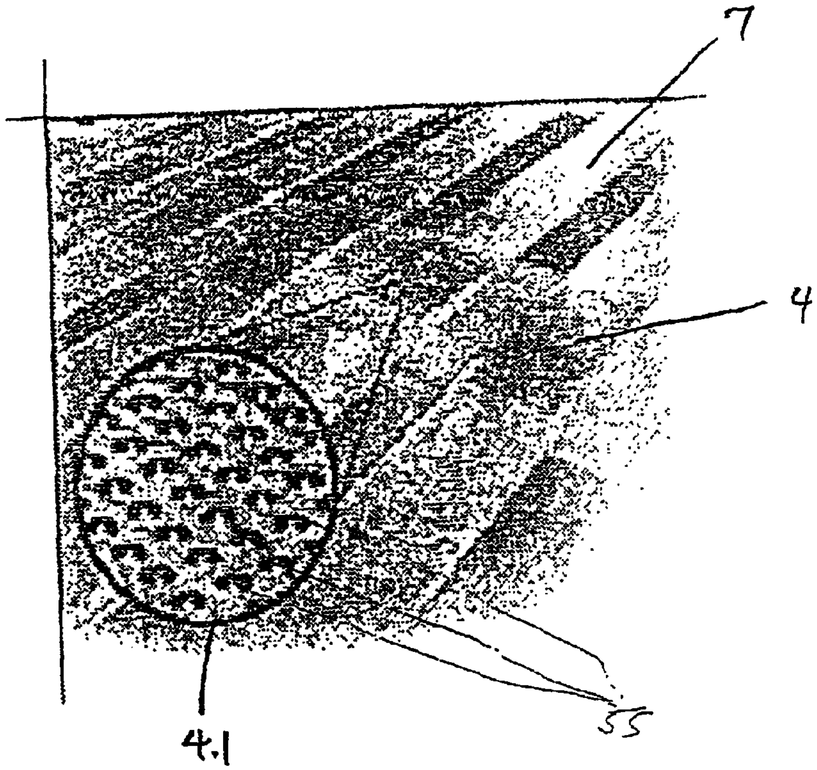
CONVENTIONAL ART FIG. 4
FIG. 4 is a schematic diagram depicting row and column addressability details of a thin CRT cathode surface, with a detailed internal diagram depicting the details of a cathode.
Figure 5A:
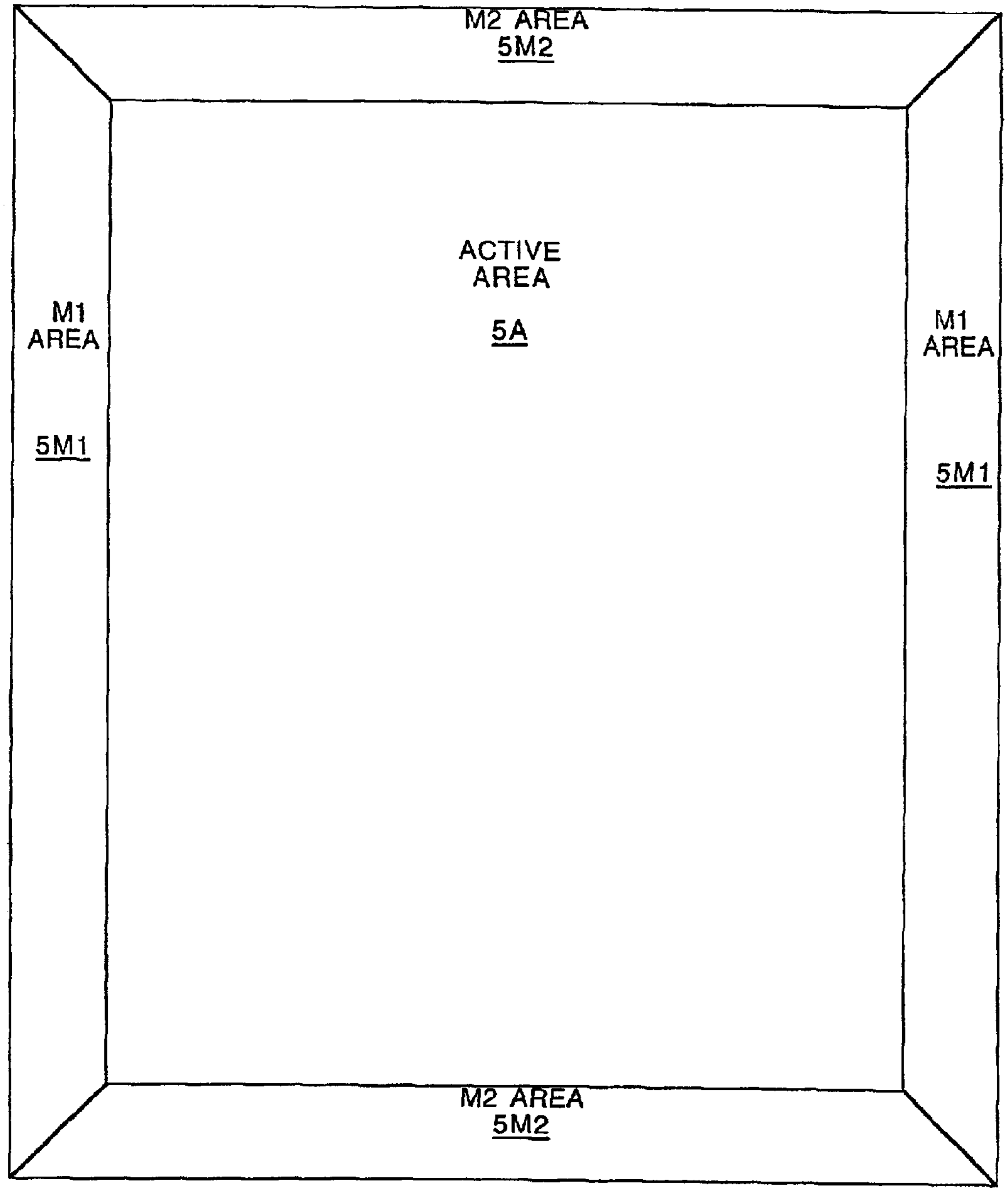
CONVENTIONAL ART FIG. 5A
FIG. 5A is a top view layout diagram depicting the relative positioning of the active area and the M1 and M2 connection pad areas of a cathode surface for a flat panel CRT.
Figure 5B:
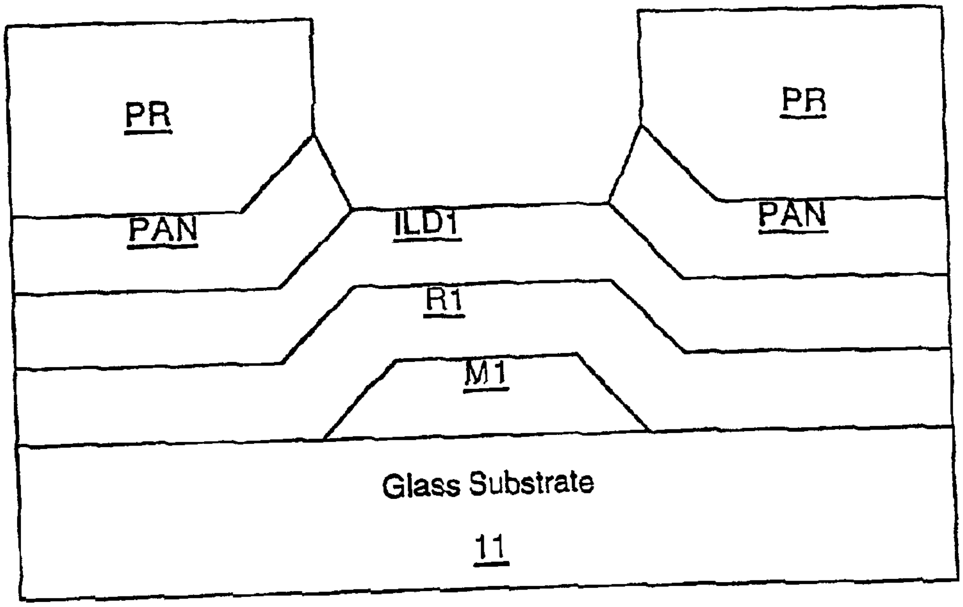
CONVENTIONAL ART Fig. 5B
FIG. 5B is a cross-sectional depiction of a composite structure in the M1 pad area.
Figure 5C:
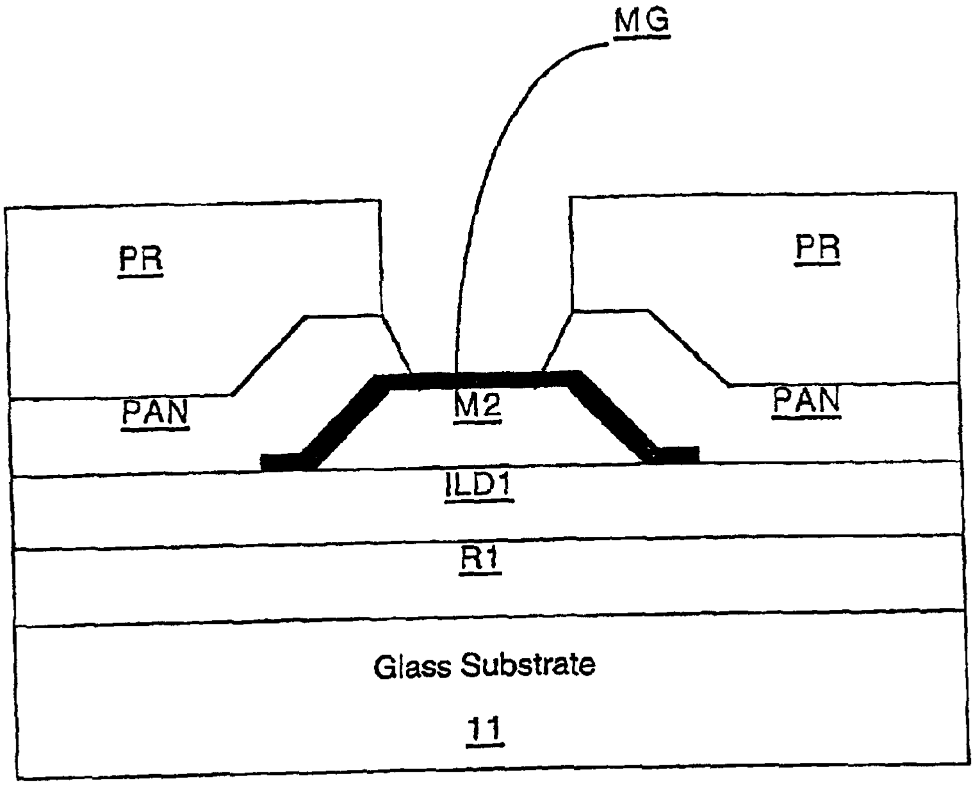
CONVENTIONAL ART Fig. 5C
FIG. 5C is a cross-sectional depiction of a composite structure in the M2 pad area.
Figure 6:
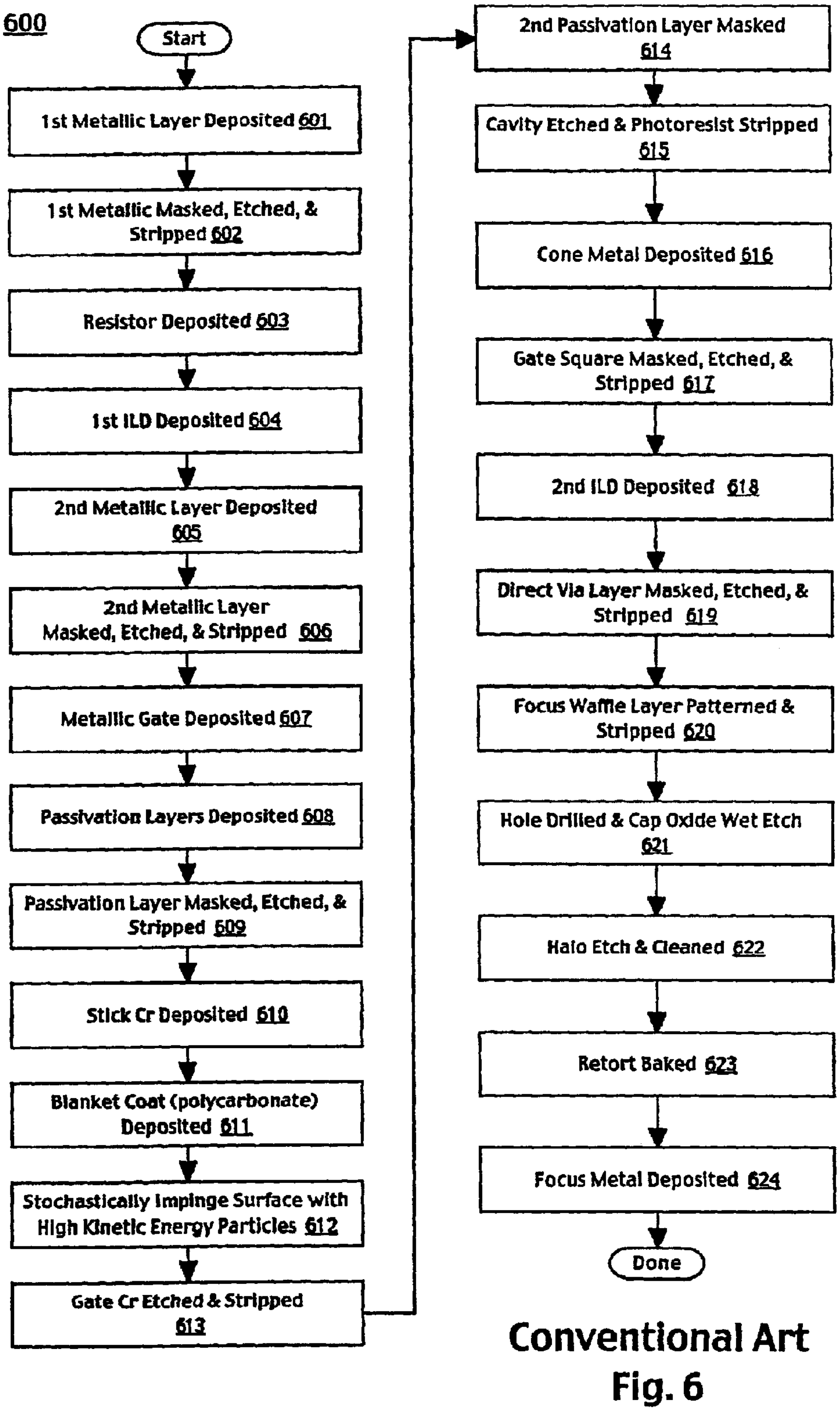
Conventional Art Fig. 6
FIG. 6 is a flowchart depicting the steps in a conventional process for fabricating a flat panel CRT cathode.

A hole is then opened for a gate aperture T1. To form the hole constituting gate aperture T1, the Cr metallic gate MG1 is etched. A cavity through the inter-layer dielectric ILD1 is also etched correspondingly, down to the surface of resistor R1, as shown in FIG. 4A. Further, in some particular places, a cavity T1 is etched down to the first metallic layer M1 and/or down to the second metallic layer M2, as depicted in FIGS. 10B and 10C, respectively.

In forming the hole and cavity, a blanket material is disposed upon the surface in its entirety; step 1020. In one embodiment, the blanket is a polycarbonate material.

Upon deposition of the polycarbonate or other blanket material, the surface, in one embodiment, is impinged by streams of high kinetic energy particles; step 1030. This essentially renders tracks in the surface, the tracks especially vulnerable to more rapid etching. In one embodiment, the tracks are iron tracks. In one embodiment, the impingement is stochastic impingement. The gate aperture is then etched accordingly utilizing techniques well known in the art such as RIE or transfer coupled plasma (TCP), and remaining polycarbonate or other blanket is stripped; step 1040.

Cavity T1 is then dry etched isotropically within the $SiO_2$ inter-layer dielectric ILD in step 1040, utilizing a technique with excellent selectivity, on the order of four to one (4:1), of $SiO_2$ to $SiN_x$, respectively, such that the $SiN_x$ passivation layer is not excessively depleted during the etching of the cavity.

In one embodiment, an etchant gas is applied which possesses a novel gas chemistry. The gas chemistry, in one embodiment, is a mixture of various relative concentrations of the following gases: octafluorocyclobutane (c-$C_4F_8$), carbon monoxide (CO), argon (Ar), and nitrogen ($N_2$). The flowrate of the gas may vary in some embodiments. In conventional applications, a second passivation layer would typically be deposited, masked and etched photolithographically using photoresist, and stripped prior to the T1 cavity etching.

Importantly, this conventional requirement is totally dispensed with by the present embodiment. Advantageously, this eliminates the requirement for a second passivation layer, as well as for the photolithographic and related processing steps, and the need for additional photoresist. Thus, the present embodiment streamlines the fabrication process, increasing production line productivity and lowering manufacturing and material costs and overall unit costs.

Figure 11C:
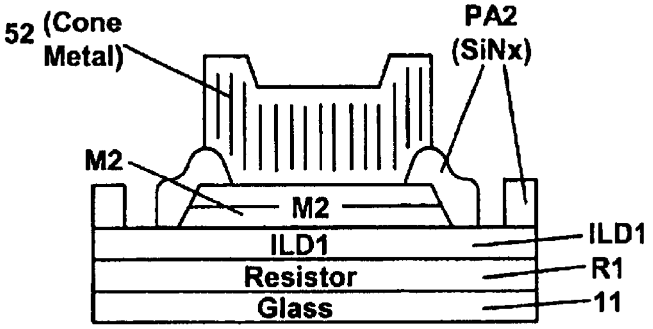
FIG. 11C is a schematic diagram depicting a cross-sectional end view of cathodic cone metal over the metallic gate (FIG. 10C) in the M2 pad area, in accordance with one embodiment of the present invention.
Figure 12A:
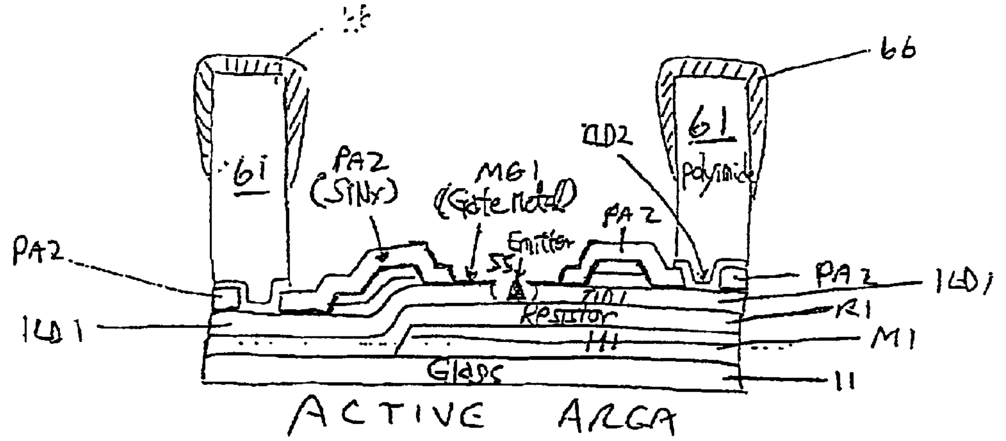
FIG. 12A is a schematic diagram depicting a longitudinal cross-sectional view of a cathode active area with polyimide walls bearing a focus waffle metallic deposition, in accordance with one embodiment of the present invention.

Importantly, eliminating the conventional requirement for a second passivation layer and etching in accordance with the present embodiment also has the additional advantage of effectuating an improvement in the operational control of the thickness of the $SiN_x$ or other constituent of the passivation layer PA2. Advantageously, this forms a precursor for a second inter-layer dielectric (e.g., second inter-layer dielectric ILD2; FIGS. 11A, 11C, 12A).

Process 1000 effectuates a method of forming an array of cavities for cathodic emitters and corresponding gates, which may be summarized as follows. Stick Cr is deposited; step 1010. A blanket coat, in one embodiment polycarbonate, is disposed over the base structure, and a preponderance of indentations is impinged kinetically into the blanket coat. Gates are etched correspondingly, and cavities for cathodic emitters are etched corresponding to said indentations; both using a new etchant gas chemistry. Importantly, the method does not require deposition of a second passivation layer nor process steps corresponding to deposition thereof. In one embodiment, this process is implemented in the active area. Advantageously, this process effectuates formation of a cathode base product with relatively few and simple steps. Alternatively, in another embodiment, the passivation layer may be etched by photolithographic masking, etching, and associated steps.

Gate Square Photolithography and Etching

Upon formation of the T1 cavity, cathodic cones 55 are deposited therein, forming a composite structure 50 by a process 1100, as depicted with reference to FIGS. 11A, 11B, 11C, and 11D. A cone metal mass 52 is deposited upon the stick Cr 41 applied over the $SiN_x$ inter-layer dielectric ILD1 and the exposed metallic gate metal MG1 surrounding the T1 cavity; step 1110 (FIG. 11C). In one embodiment, the cone metal mass 52 is Cr. In one embodiment, the cone metal mass is Mo. In one embodiment, the cone metal mass is an alloy of Cr and Mo. Other group VI metals may be alloyed with the cone metal in other embodiments.

Cone metal from cone metal mass 52 is forced to slough off into the T1 cavity, where it agglomerates into a cone shape 55; step 1120 (FIG. 11D). In the active region, the cathode cone 55 adheres at its base to the surface of resistor R1, if a resistor is used in a particular embodiment, or directly in contact with conductor M1, exposed within the T1 cavity, if a resistor (e.g., resistor R1) is used in a particular embodiment. If no resistor is used in a particular embodiment, the cathode cone 55 is applied directly in contact with metal conductor M1 in the active area. The cathodic cone 55 is centered within the T1 cavity such that its tip is substantially centered within its annular opening of Cr metal gate MG1.

Figure 11B:
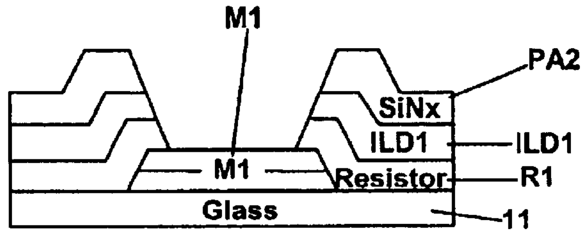
FIG. 11B is a schematic diagram depicting a cross-sectional end view of a of a first metallic layer with substantially overlying passivation material (FIG. 9B) in the M1 pad area, after etching of stick Cr, in accordance with one embodiment of the present invention.
Figure 11D:
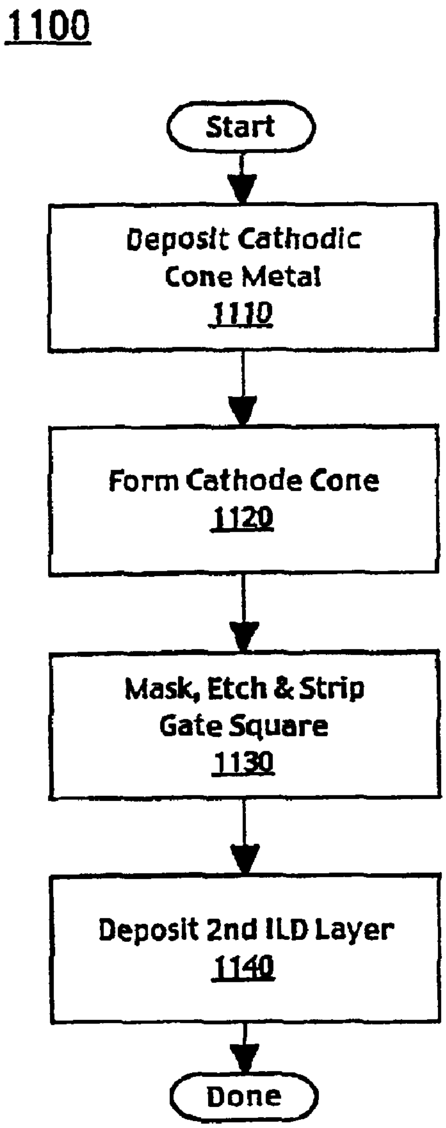
FIG. 11D is a flowchart of the steps in a process for formation of a fifth composite structure for a cathode fabrication, in accordance with one embodiment of the present invention.

Referring to FIG. 11B, it is seen that no cone metal is deposited in the M1 pad area over opening 39*b* exposing a surface of first metallic layer M1 through passivation layer PA2, inter-layer dielectric ILD1, and resistor R1, respectively. However, as seen by reference to FIG. 11C, cone metal mass 52*c* is also applied over cavity 39*c* (FIG. 9C) in contact with Cr gate metal MG1 covering the exposed surface of second metallic layer M2 in the M2 pad area. The cone metal mass 52*c* is centered on and supported by the $SiN_x$ inter-layer dielectric ILD1 there. The cone metal mass 52*c* masks, seals, and protects the M2 conductor surface in the M2 pad area during subsequent process steps.

Upon deposition of the cone metal, a gate square GS is formed by photolithographically patterning and etching, and subsequently stripping of remaining gate metal 52; step 1130 (FIG. 11D). A second $SiO_2$ inter-layer dielectric ILD2 is then deposited; step 1140. This completes process 1100.

Focal Structure Formation and Finishing Stage Composite Structure

Figure 12B:
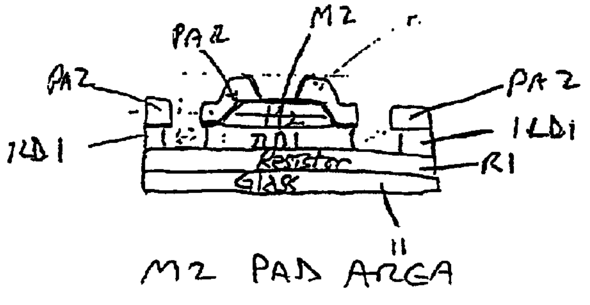
FIG. 12B is a schematic diagram depicting a cross-sectional end view of a cathodic cone metal over the metallic gate (FIG. 11C) in the M2 pad area, with cone metal removed, in accordance with one embodiment of the present invention.
Figure 12C:
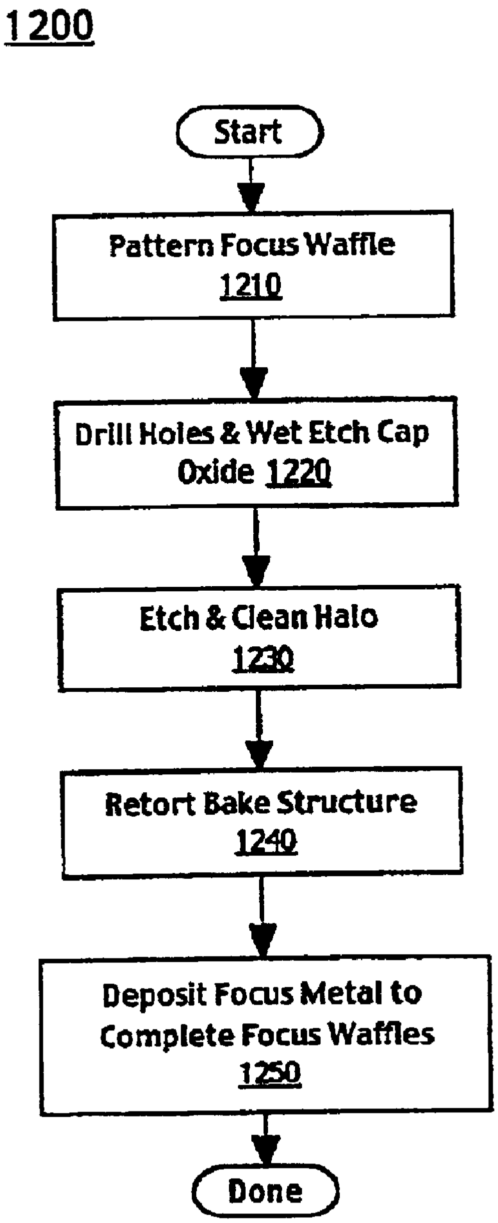
FIG. 12C is a flowchart of the steps in a process for formation of a sixth composite structure for a cathode fabrication, in accordance with one embodiment of the present invention.

Referring to FIG. 12A, a focal structure formation is fabricated by a process 1200 of FIG. 12C. Process 1200 begins with step 1210, wherein focus waffles are patterned. Focus waffle supports 61 are grown in the active area at the edges of composite cathode structure 60, as depicted in FIG. 12A. In one embodiment, focus waffle supports 61 are fabricated by a polyimide material. In one embodiment, another organic polymer constitutes the material of the focus waffle supports 61.

In step 1220, the second inter-layer dielectric ILD2 cap is removed by wet etching. With reference again to FIG. 12A, the focus waffle supports 61 are formed in places patterned for their growth, e.g., halo 63. Holes 62 are drilled, in one embodiment, into the second inter-layer dielectric ILD2, and the surface thus exposed is subjected to a cap oxide wet etch, in one embodiment, using acetone, by techniques well known in the art.

Referring to FIG. 12B, a halo 63 is etched concentrically surrounding second metallic layer M2 in the M2 pad area, in one embodiment, by techniques well known in the art, such as isotropic etching. The halo 63 is then cleaned by techniques known in the art. These activities constitute step 1230.

The polyimide or other polymeric focus waffle supports 61 are then prepared for further treatment by retort baking; step 1240.

Focus metal 66 is deposited by methods well known in the art, such as MOCVD, other CVD, PVD, electroplating, and/or electroless plating, upon the focus waffle supports 61, in a position to electrostatically focus electron beams which will be emitted by the cathodic cone 55. This constitutes step 1250. In one embodiment, focus metal 66 is constituted from the same metals chosen for the cathodes and gates. Focus metal 66 and focus waffle supports 61 compositely form focus waffles 66. Process 1200 is complete, and a correspondingly completed cathode product is ready for use in subsequent flat panel CRT fabrication.

In summary, the present invention provides a method of fabricating a cathode requiring relatively few and somewhat simple steps. In one embodiment, a novel etchant gas chemistry dispenses with needing a second passivation layer. In one embodiment, a direct via is formed without a separate mask. In one embodiment, access and isolation features of a metallic gate are patterned in the same patterning operation as an associated passivation layer, dispensing with a need for separate patterning of each. In one embodiment, etching is effectuated with high selectivity for nitrides of silicon. In one embodiment, the requirement for at least one passivation layer deposition, a direct via masking step, and separate patterning steps for the passivation layer and metallic gate are eliminated. This effectively eliminates or substantially reduces associated costs, concomitantly reducing process completion time. Advantageously, this increases efficiency and productivity, correspondingly reducing fabrication costs and unit costs of finished devices.

In a cathode array for a flat panel display having a base structure constituted by an inter-layer dielectric disposed upon a glass substrate and covering a first metallic conductor, which is disposed upon at least a part of the glass substrate in a first conductor pad area, and a second metallic conductor, which is disposed upon at least a part of the inter-layer dielectric in a second conductor pad area, the second conductor covered by a layer of chromium, one embodiment effectuates a method of fabricating an intermediate structure and forming a direct via for an electrical access to the first and said second metallic conductors. The method operates by depositing a passivation layer upon the base structure, patterning it according to a pattern, in response to a determination that the passivation layer is to be etched without high selectivity to nitrides of silicon with respect to oxides of silicon, also patterning the layer of chromium according to the pattern, in response to a determination that that the passivation layer is to be etched with high selectivity to nitrides of silicon with respect to oxides of silicon, patterning said layer of chromium separately, etching said passivation layer accordingly, etching said layer of chromium accordingly, and etching said inter-layer dielectric accordingly. This method does not require deposition of a second passivation layer, nor process steps corresponding to deposition thereof. Further, this method does not require deposition of a photoresistive mask for etching the direct via, nor process steps corresponding to deposition thereof. In one embodiment, an intermediate structure and direct electrical access via product is formed by a process that effectively implements this method.

The preferred embodiment of the present invention, a method for implementing an efficient and economical cathode process, is thus described. While the present invention has been described in particular embodiments, it should be appreciated that the present invention should not be construed as limited by such embodiments, but rather construed according to the following claims.

What is claimed is:

1. A method for fabricating an intermediate structure for a cathode array of a flat panel display comprising:

depositing a passivation layer of substantially nitride of silicon upon a base structure comprising an oxide of silicon inter-layer dielectric disposed upon a glass substrate, wherein said interlayer dielectric covers a first metallic conductor disposed upon at least a part of said glass substrate in a first conductor pad area, and a second metallic conductor, said second metallic conductor disposed upon at least a part of said inter-layer dielectric in a second conductor pad area, said second conductor covered by a layer of chromium;

patterning said passivation layer according to a first pattern;

in response to a determination that said passivation layer is to be etched without selectivity to nitrides of silicon with respect to oxides of silicon, further patterning said layer of chromium according to said first pattern;

in response to a determination that said passivation layer is to be etched with selectivity to nitrides of silicon with respect to oxides of silicon sufficient to avoid undesirable etching of said interlayer dielectric layer, patterning said layer of chromium according to a second pattern, wherein said second pattern is separate from said first pattern;

upon said patterning said layer of chromium according to said first pattern, etching said passivation layer using an etching technique selected from the group consisting of at least one of nitride of silicon dry etching, reactive ion etching, gaseous etching, and plasma assisted dry etching;

upon said patterning said layer of chromium according to said second pattern, etching said passivation layer using nitrides of silicon dry etching;

etching said layer of chromium; and etching said inter-layer dielectric using an inter-layer dielectric wet etch.

2. The method as recited in claim 1, wherein said performing a nitrides of silicon dry etch comprises application of a gas mixture.

3. The method as recited in claim 2, wherein said gas mixture comprises sulfur hexafluoride, carbon tetrafluoride, trifluoromethane, and oxygen.

4. The method as recited in claim 2, wherein said gas mixture comprises octafluorocyclobutane, carbon monoxide, and argon.

5. The method as recited in claim 4, wherein said gas mixture further comprises nitrogen.

6. The method as recited in claim 1, wherein said base structure further comprises a resistor disposed between said glass substrate and said inter-layer dielectric, and between said first metallic conductor and said inter-layer dielectric.

7. The method as recited in claim 6, wherein said method further comprises performing a dual resistor etch.

8. The method as recited in claim 1, wherein said first pattern comprises a template for a layout of said passivation layer.

9. The method as recited in claim 8, wherein said first pattern further comprises a template for a layout of said layer of chromium.

10. The method as recited in claim 9, wherein said patterning said layer of chromium according to said first pattern further comprises conforming said layout of said layer of chromium to said pattern.

11. The method as recited in claim 10, wherein said patterning said layer of chromium according to said first pattern further comprises fixing a location for an access spot and an electrical isolation area.

* * * * *